US005945929A

United States Patent [19]
Westra

[11] Patent Number: 5,945,929
[45] Date of Patent: Aug. 31, 1999

[54] TOUCH CONTROL POTENTIOMETER

[75] Inventor: Michael Allen Westra, Grand Haven, Mich.

[73] Assignee: The Challenge Machinery Company, Grand Haven, Mich.

[21] Appl. No.: 08/940,071

[22] Filed: Sep. 29, 1997

Related U.S. Application Data

[60] Provisional application No. 60/027,452, Sep. 27, 1996.

[51] Int. Cl.[6] .............................................. H03M 11/00
[52] U.S. Cl. ............................ 341/34; 338/99; 338/114
[58] Field of Search .............................. 341/34; 338/114, 338/115, 176, 92, 99, 95; 200/5 A; 84/690; 345/173

[56] References Cited

U.S. PATENT DOCUMENTS

| | | | |
|---|---|---|---|
| 4,257,305 | 3/1981 | Friend et al. | 84/690 |
| 4,494,105 | 1/1985 | House | 338/114 |
| 4,570,149 | 2/1986 | Thornburg et al. | 338/114 |
| 4,651,123 | 3/1987 | Zepp | 338/176 |
| 4,958,138 | 9/1990 | Hawranek et al. | 338/114 |
| 4,975,676 | 12/1990 | Greenhalgh | 338/114 |
| 5,079,536 | 1/1992 | Chapman | 339/99 |
| 5,334,967 | 8/1994 | Paszkiewicz | 338/95 |
| 5,550,339 | 8/1996 | Haugh | 200/5 A |

*Primary Examiner*—Michael Horabik
*Assistant Examiner*—Albert K. Wong
*Attorney, Agent, or Firm*—Rader, Fishman, Grauer & McGarry

[57] ABSTRACT

A touch control potentiometer is formed of a lower lamina bearing on its upper surface a conductive trace of elongate outline, an upper lamina being flexible under digital pressure and bearing on its lower surface a second conductive trace aligned with the first trace and having the outline thereof, a central lamina being interposed between the upper and lower laminae and formed with an aperture aligned with the first and second traces and having an outline complementary to the outline common to them, one of the traces being formed of a material having relatively high electrical resistance, the other of the traces being formed of a material having relatively low electrical resistance, and a plurality of electrically conductive leads extending outwardly from the laminate and comprising first and second leads in contact with the said one trace at its ends, and a third lead in contact with said other trace at one end one of its ends. A cover lamina is superimposed upon the upper lamina, a static shield layer being carried by the cover lamina at its lower surface to draw off static charges, a graphic layer being carried by the cover lamina at its upper surface thereof and bearing printed indicia. Also disclosed is apparatus incorporating the potentiometer in a control system.

10 Claims, 1 Drawing Sheet

TOUCH CONTROL POTENTIOMETER

This claims the benefit of U.S. provisional patent application Ser. No. 60/027,452, filed Sep. 27, 1996.

BACKGROUND OF THE INVENTION

1. Field of the Invention

This invention relates generally to voltage dividers or potentiometers, and more particularly, to a potentiometer which not only has no moving parts in the usual sense of that expression but is actuable by mere touch, as by the fingertip of an operator. Still more particularly, the invention also relates to a device, a paper cutter or the like for example, having an element such as a backgage which may be moved and positioned by means of a potentiometer according to the invention.

2. The Prior Art

Mechanical potentiometers have long been known in which, typically, a conductive element or wiper is axially movable along the outer surface of a resistor, such as a coil of conductive wire of known resistance, in electrical contact therewith. An electric potential of constant magnitude is applied to the opposite ends of the resistor, and the wiper and one of the ends are connected in an electric circuit also containing one or more elements to be controlled or otherwise acted upon. The magnitude of the resistance interposed in the circuit by the conductor depends upon the axial position of the wiper relative to the ends of the conductor, whereby it is possible to vary the potential applied to other elements of the circuit by moving the wiper in either axial direction. Obviously, the magnitude of this potential may never be greater than that of the constant overall potential applied to the ends of the conductor.

U.S. Pat. No. 4,651,123, issued Mar. 17, 1987 to L. P. Zepp discloses a sandwich-type linear potentiometer in which a pair of elongate conductive strips are carried on a pair of nonconductive flexible plastic substrates in spaced relationship. In use an upper one of the substrates is engaged by a spring-loaded ball assembly which can be moved longitudinally relative to the strips to bring them into contact with each other, the resistance provided by the potentiometer varying according to the location of the point of contact.

In another technology, so-called membrane switches are also now well known and in recent years have been increasingly incorporated in the electric control panels of such devices as microwave ovens and calculators in place of the previously customary push-button keypads. Such a control panel presents a smooth outer surface bearing graphic indicia which represent the various values or functions assigned to the membrane switches disposed below the surface and out of sight. Merely pressing the surface with the fingertip at one of the indicia will activate the respective switch therebeneath. Like mechanical switches, membrane switches are normally in one of only two conditions, namely an "on" or activated condition and an "off" or inactivated condition. They are available from various sources, one source being SSI Electronics, Inc. of Grand Rapids, Mich.

U.S. Pat. No. 4,975,676, issued Dec. 4, 1990 to V. B. Greenhalgh, discloses a touch-controlled circuit apparatus for use in regulating ovens and the like, which provides such switches by means of a flexible glass membrane spaced above a rigid support layer, electrical circuitry being printed on the facing surfaces of the glass membrane and the support layer. In addition to the switches, this circuitry also provides a continuously variable linear potentiometer actuated by finger pressure. By moving the finger in either of two linear directions, the user may increase or decrease the setting of a clock, minute timer, cook time, or stop time.

U.S. Pat. No. 5,550,339, issued Aug. 27, 1996 to J. E. Haugh, also discloses a flexible cover spaced above a substrate, both carrying conductive films. In this instance, when pressure is applied to the cover at any point relative to a nonconductive zero-point, thereby bringing the films into electrical contact, it is said that "intent, direction and magnitude" are thereby indicated and that this information may be used to control tools such as automobiles, computers, appliances, toys, laboratory equipment "and other diverse machines and devices." However, no such tools or the circuitry to control them are specifically described or illustrated.

SUMMARY OF THE INVENTION

Taken broadly, the present invention provides a potentiometer similar to a membrane switch but having a virtually infinite number of positions to vary electric potential selectively by means of fingertip pressure.

More particularly, the invention provides a touch control potentiometer comprising a plurality of laminae joined to form a laminate, each of the laminae being formed of electrically nonconductive material and having an upper surface and a lower surface opposite from the upper surface. A lower one of the laminae bears on its upper surface a first electrically conductive trace of elongate outline. An upper one of the laminae is flexible under digital pressure and bears on its lower surface a second electrically conductive trace aligned with the first trace and having the same outline. A central one of the laminae is interposed between the upper and lower laminae. It is also formed with an aperture aligned with the first and second traces and having an outline complementary to the outline common thereto.

One of the traces is formed of a material having relatively high electrical resistance, whereas the other is formed of a material having relatively low electrical resistance. A pair of electrically conductive leads is in contact with the high-resistance trace at its respective ends and extend outwardly from the laminate. A third electrically conductive lead is in contact with the low-resistance trace at one end thereof and also extends outwardly of the laminate.

Preferably, an additional lamina is provided as a cover lamina superimposed upon the upper lamina, a static shield layer preferably being carried by the cover lamina at the lower surface thereof and formed of a conductive material, the static shield layer being adapted to be connected to ground to draw off static charges.

It is also preferred that a graphic layer be carried by the cover lamina at the upper surface thereof to bear printed indicia.

The high-resistance trace is preferably formed of carbon and the low-resistance trace of silver.

Moreover, it is preferably the first trace or lower trace that is formed of carbon and the second or upper trace that is formed of silver.

The invention also provides an apparatus, for example a paper cutter, having a movable member, for example a backgage, and a control system for positioning the movable member, the control system including a touch control potentiometer as disclosed herein, a controller board having an analog-to-digital converter, an electric motor connected to drive the movable member, and a pair of controller outlet leads extending from the controller board to the motor to conduct drive signals from the controller board to the motor.

The three leads extending from the potentiometer laminate are directed to the controller board to conduct input signals thereto.

Other objects, features, and advantages of the invention will be apparent from the ensuing description in conjunction with the accompanying drawings.

BRIEF DESCRIPTION OF THE DRAWINGS

In the drawings:

FIG. 2 is a diagrammatic representation of a control system including a potentiometer according to the invention for controlling the movement and position of a movable element of a device such as a paper cutter or the like.

DESCRIPTION OF THE PREFERRED EMBODIMENT

Figure 1:
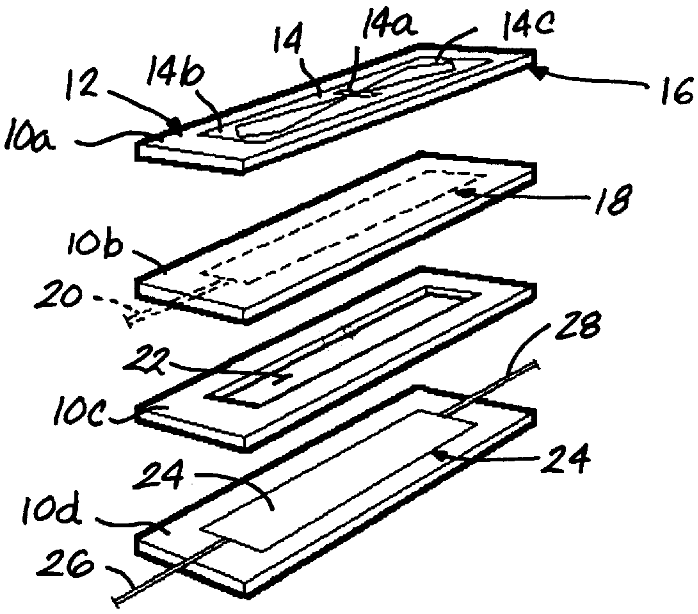
FIG. 1 is an exploded, perspective view of a touch control potentiometer according to the invention.

Referring first to FIG. 1, there is shown in exploded or disassembled form a touch control potentiometer 10 according to the invention. This may be called a membrane potentiometer and comprises essentially a laminate made up in this instance of four laminae 10*a*, 10*b*, 10*c*, and 10*d*, respectively, formed of a nonconductive flexible material, suitably a polyester or polycarbonate material. Each of the laminae 10*a*–10*d* has an upper surface visible in FIG. 1, and a lower surface which is not visible but is opposite from the upper surface. When assembled, the engaged surfaces of adjoining laminae are conveniently joined to each other by adhesive, preferably preapplied and comprising a pressure-sensitive type thereof.

The outer or cover lamina 10*a* has as its upper surface a thin graphic layer 12 of any suitable material bearing printed indicia 14. The indicia may take any convenient form, but in this instance comprise a zero or neutral point 14*a* and opposite end points 14*b* and 14*c*, the significance of which will become clear hereinafter. At the lower surface of lamina 10*a* there is provided a thin layer 16 of conductive material connected to ground (not shown) to draw off any static charges and thus form a static shield.

Directly beneath lamina 10*a* is an upper lamina 10*b*, to the lower surface of which has been applied, as by silk-screening, an elongate silver trace 18 analogous to the wiper of a traditional or conventional potentiometer. The silver trace is laid over a lead 20 applied to upper lamina 10*b* in any suitable manner.

A central lamina 10*c* comprises a spacer formed with an aperture 22 complementary to the outline of silver trace 18.

Applied to the upper surface of inner or lower lamina 10*d*, suitably by silk-screening, is an elongate carbon resistive trace 24 aligned with and having the same outline common to silver trace 18 of upper lamina 10*b* and aperture 22 of spacer lamina 10*c*. The carbon trace is analogous to the resistor of a traditional or conventional potentiometer and may suitably represent a total resistance from end to end of, say, 1,000 to 2,000 ohms. It is laid over a pair of leads 26 and 28 disposed at its opposite ends respectively.

It will be apparent that in the assembled condition of the membrane potentiometer 10, the laminae 10*a*–10*d* are stacked and adhered together so that in the inactive condition of the potentiometer, silver trace 18 is spaced above and faces carbon trace 24. Cover lamina 10*a* and the adjoining upper lamina 10*b* are of thicknesses to be readily but resiliently depressed at any point of printed indicia 14.

Figure 2:
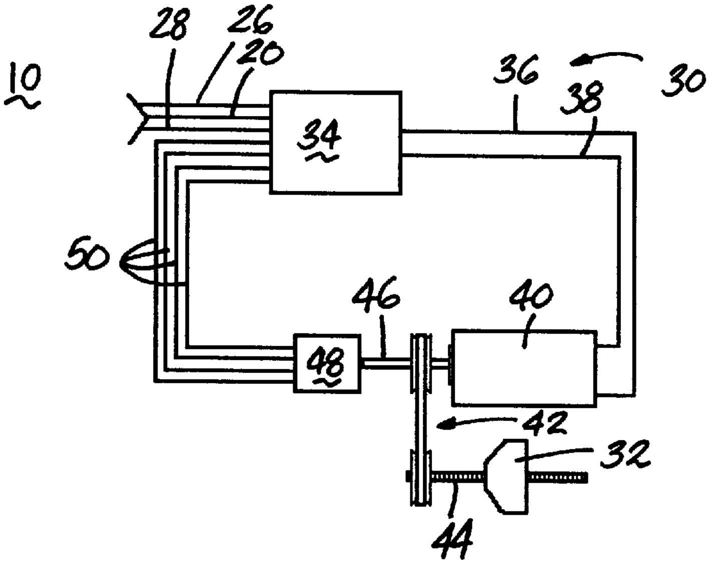

Turning now to FIG. 2, membrane potentiometer 10 is shown diagrammatically as incorporated in a control system 30 for the backgage 32 of a paper cutter or the like, other elements of which are not shown. As is customary in such devices, the position of the backgage determines the cut width of the paper or other material to be processed.

In control system 30, leads 20, 26, and 28 (see also FIG. 1) are directed as input leads to a controller board 34 which comprises a microcomputer having an analog-to-digital converter (not specifically shown). A pair of output leads 36 and 38 extend from controller board 34 to a backgage motor 40 whose output is transferred by any suitable transmission, such as belt-and-pulley transmission 42, to a lead screw 44 threadedly engaged with backgage 32.

The output of backgage motor 40 is also transmitted, as by a shaft 46, to a motor encoder 48 which provides feedback data to controller board 34 in the form of signals transmitted by way of leads 50. The elements 34 to 50 of control system 30 just described are well known to the person of ordinary skill in the art and are readily available from various sources.

In operation, movement and positioning of backgage 32 may be accomplished by the mere touch of the operator's finger tip. With control system 30 energized, a potential, say 4 volts, is applied between leads 26 and 28 and thereby between the opposites ends of carbon trace 24. If the operator depresses upper lamina 10*a* at the zero or neutral point 14*a*, which is situated above and midway between the opposite ends of both silver trace 18 and carbon trace 24, the adjacent lamina 10*b* will also be depressed at a corresponding point and the traces will be brought into contact at that point. Now a potential of, say, 2 volts will exist between lead 20 and each of leads 26 and 28. Control board 34 will receive this information by way of leads 20, 26, and 28 as an analog voltage which its microcomputer has been programmed to read as a neutral or "hold" signal, and therefore controller board 34 will transmit no output to backgage motor 40.

If, however, the operator with his fingertip depresses laminae 10*a* and 10*b* at any point between neutral point 14*a* and one of the ends 14*b* or 14*c* of the printed indicia 14, a different analog voltage will be read by the microcomputer, which will then transmit a signal to the backgage motor 40 in the form of a particular digital voltage. The microcomputer will also be programmed to determine the direction of rotation of the backgage motor depending upon whether the point of pressure is between points 14*a* and 14*b* or between points 14*a* and 14*c*. Moreover, the distance of the point of pressure from the neutral point 14*a* will be read by the microcomputer to regulate the speed of the backgage motor. Specifically, the closer the point is to one of the ends 14*b* or 14*c* of the indicia, the greater will be the speed of the motor.

In any case, when the operator's fingertip is lifted from the upper lamina 10*a*, contact between the silver trace and the carbon trace is broken as laminae 10*a* and 10*b* return to their original unflexed state, and controller board 34 will signal the backgage motor to cease its rotation by removing the digital voltage applied to leads 36 and 38, thereby positioning the backgage 32.

In the meantime, motor encoder 48 will continuously sense the position and motion of the backgage motor and so inform the microcomputer of controller board 34, which will compare these feedback signals with the analog voltage input and digital voltage output to continuously monitor and correct the movement and position of the backgage motor.

While the invention has been particularly described in connection with a certain specific embodiment thereof, it is to be understood that this is by way of illustration and not of limitation, and the scope of the appended claims should be construed as broadly as the prior art will permit.

What is claimed is:

1. A touch control potentiometer comprising a plurality of laminae joined to form a laminate, each of the laminae being formed of electrically nonconductive material and having an upper surface and a lower surface opposite from the upper surface, a lower one of the laminae bearing on the upper surface thereof a first electrically conductive trace of elongate outline, an upper one of the laminae being flexible under digital pressure and bearing on the lower surface thereof a second electrically conductive trace aligned with the first trace and having the outline thereof, a central one of the laminae being interposed between the upper and lower laminae and formed with an aperture aligned with the first and second traces and having an outline complementary to the outline common thereto, one of the traces being formed of a material having relatively high electrical resistance, the other of the traces being formed of a material having relatively low electrical resistance, and a plurality of electrically conductive leads extending outwardly from the laminate and comprising first and second leads in contact with said one trace at respective ends thereof, and a third lead in contact with said other trace at one end thereof.

2. A touch control potentiometer according to claim 1, wherein a further one of the laminae comprises a cover lamina superimposed upon the upper lamina, a static shield layer being carried by the cover lamina at the lower surface thereof and formed of a conductive material, the static shield layer being adapted to be connected to ground to draw off static charges.

3. A touch control potentiometer according to claim 1, wherein a further one of the laminae comprises a cover lamina superimposed upon the upper lamina, a graphic layer being carried by the cover lamina at the upper surface thereof and bearing printed indicia thereon.

4. A touch control potentiometer according to claim 1, wherein said one trace is formed of carbon and said other trace is formed of silver.

5. A touch control potentiometer according to claim 1, wherein the first trace is formed of carbon and the second trace is formed of silver.

6. An apparatus having a movable member and a control system for positioning the movable member, the control system including a touch control potentiometer, a controller board having an analog-to-digital converter, an electric motor connected to drive the movable member, and a pair of controller outlet leads extending from the controller board to the motor to conduct drive signals from the controller board to the motor, the potentiometer comprising a plurality of laminae joined to form a laminate, each of the laminae being formed of electrically nonconductive material and having an upper surface and a lower surface opposite from the upper surface, a lower one of the laminae bearing on the upper surface thereof a first electrically conductive trace of elongate outline, an upper one of the laminae being flexible under digital pressure and bearing on the lower surface thereof a second electrically conductive trace aligned with the first trace and having the outline thereof, a central one of the laminae being interposed between the upper and lower laminae and formed with an aperture aligned with the first and second traces and having an outline complementary to the outline common thereto, one of the traces being formed of a material having relatively high electrical resistance, the other of the traces being formed of a material having relatively low electrical resistance, and a plurality of electrically conductive leads extending from the laminate to the controller board to provide input signals to the controller board, said plurality of leads comprising first and second leads in contact with said one trace at respective ends thereof, and a third lead in contact with said other trace at one end thereof.

7. An apparatus according to claim 6, including a motor encoder connected to receive output signals from the motor, and means for providing feedback data from the motor encoder to the controller board.

8. An apparatus according to claim 6, wherein a further one of the laminae comprises a cover lamina superimposed upon the upper lamina, a static shield layer being carried by the cover lamina at the lower surface thereof and formed of a conductive material, the static shield layer being adapted to be connected to ground to draw off static charges.

9. An apparatus according to claim 6, wherein a further one of the laminae comprises a cover lamina superimposed upon the upper lamina, a graphic layer being carried by the cover lamina at the upper surface thereof and bearing printed indicia thereon.

10. An apparatus according to claim 6, wherein the movable member comprises a backgage for a paper cutter.

* * * * *